United States Patent
Ou et al.

[11] Patent Number: 5,963,113
[45] Date of Patent: Oct. 5, 1999

[54] SAW LADDER FILTER WITH INTER-STAGE MATCHING SAW RESONATOR

[75] Inventors: Hok Huor Ou; Naoto Inose, both of Tokyo, Japan

[73] Assignee: Oki Electric Industry Co., Ltd., Tokyo, Japan

[21] Appl. No.: 09/030,284

[22] Filed: Feb. 25, 1998

[30]   Foreign Application Priority Data

Apr. 23, 1997  [JP]  Japan ..................................... 9-106112

[51] Int. Cl.$^6$ .................................................. H03H 9/64
[52] U.S. Cl. ........................................... 333/193; 333/195
[58] Field of Search ..................................... 333/193–196; 310/313 R, 313 B, 313 C, 313 D

[56]   References Cited

U.S. PATENT DOCUMENTS

| 5,471,178 | 11/1995 | Hickernell ................................ 333/193 |
| 5,559,481 | 9/1996 | Satoh et al. .......................... 333/194 X |
| 5,592,135 | 1/1997 | Taguchi et al. ...................... 333/195 X |

FOREIGN PATENT DOCUMENTS

| 0 718 970 A1 | 6/1996 | European Pat. Off. . |
| 0 732 806 A2 | 9/1996 | European Pat. Off. . |
| 6-69750 | 3/1994 | Japan . |
| 7-086871 | 3/1995 | Japan . |
| 2 286 304 | 8/1995 | United Kingdom . |

OTHER PUBLICATIONS

Ikata et al., "Development of Small Antenna Duplexer Using SAW Filters for Handheld Phones", 1993 Ultrasonics Symposium, pp. 111–114.

*Primary Examiner*—Robert Pascal
*Assistant Examiner*—Barbara Summons
*Attorney, Agent, or Firm*—Venable; Robert J. Frank; Allen Wood

[57]   ABSTRACT

A SAW filter has SAW resonators coupled in a ladder network with at least one π-type section. Besides having a series-arm SAW resonator and two shunt-art SAW resonators, the π-type section has an inter-stage matching SAW resonator coupled in series with the series-arm SAW resonator. The inter-stage matching SAW resonator has an interdigital transducer with an electrode finger pitch substantially equal to the pitch in the series-arm SAW resonator. The inter-stage matching SAW resonator reduces impedance mismatching between the left half and the right half of the π-type section.

12 Claims, 11 Drawing Sheets

SAW LADDER FILTER WITH INTER-STAGE MATCHING SAW RESONATOR

BACKGROUND OF THE INVENTION

The present invention relates to a surface-acoustic-wave filter, more particularly to improving the transmission characteristics of a surface-acoustic-wave filter of the resonator type.

Surface-acoustic-wave (hereinafter, SAW) devices in general have an interdigital transducer (IDT) that excites a surface acoustic wave on a piezoelectric substrate. The interdigital transducer can be designed to give the SAW device various characteristics and functions, the filtering function being among the most important. In the past, SAW filters in which surface acoustic waves propagated between two or more interdigital transducers were predominant, but much recent research has focused on SAW filters of the resonator type.

A SAW resonator has a single interdigital transducer, and may have reflectors to keep surface acoustic waves from escaping from the interdigital transducer. The impedance characteristics of a SAW resonator are quite similar to the impedance characteristics of an inductor-capacitor (LC) resonator, so a SAW filter comprising SAW resonators can be designed by classical methods of electrical filter design. In particular, multiple-stage SAW filters can be designed in this way. A simple example is a two-stage SAW filter having a π or T configuration.

In the past, however, inadequate consideration has been given to impedance matching between the different stages of multiple-stage SAW filters. This appears to have been the cause of certain problems that are often seen in the transmission characteristics of SAW filters, and has limited the usefulness of such filters. Further details will be given below.

SUMMARY OF THE INVENTION

A general object of the present invention to improve the transmission characteristics of a resonator-type SAW filter.

A more specific object is to reduce insertion loss at the low-frequency end of the passband.

Another object is to reduce reflection-loss anomalies at the low-frequency end of the passband.

A further object is to increase attenuation in the upper stopband of a resonator-type SAW filter.

A still further object is to increase the width of the upper stopband.

The invented resonator-type SAW filter has a plurality of SAW resonators with respective interdigital transducers formed on a piezoelectric substrate, coupled in a ladder network. The ladder network has at least one π-type section with a first ladder stage and a second ladder stage, collectively formed by at least one series-arm SAW resonator and at least two shunt-arm SAW resonators.

The π-type section also comprises an inter-stage matching SAW resonator coupled in series with the series-arm SAW resonator. The inter-stage matching SAW resonator has an interdigital transducer with an electrode finger pitch substantially equal to the electrode finger pitch of the interdigital transducer of the series-arm SAW resonator. The inter-stage matching SAW resonator reduces impedance mismatching between the first and second ladder stages of the π-type section.

If the interdigital transducers in the inter-stage matching SAW resonator and the series-arm SAW resonator have exactly the same electrode finger pitch, these two SAW resonators can be combined into a single SAW resonator.

If the electrode finger pitches are not exactly the same, the interdigital transducer in the inter-stage matching SAW resonator should have a more narrow electrode finger pitch than the interdigital transducers in the series-arm SAW resonator, so that the resonant frequency and antiresonant frequency of the inter-stage matching SAW resonator are higher than the resonant frequency and antiresonant frequency of the series-arm SAW resonator.

The π-type section may have a plurality of inter-stage matching SAW resonators, which collectively reduce impedance mismatching between the first and second ladder stages of the π-type section. In this case, the inter-stage matching SAW resonators preferably have interdigital transducers with different electrode finger pitches, all more narrow than the electrode finger pitch in the series-arm SAW resonator.

By reducing impedance mismatching between the first and second ladder stages of the π-type section, the inter-stage matching SAW resonator or resonators improve the transmission characteristics of the SAW filter, specifically in regard to insertion loss and reflection loss at the low-frequency end of the passband.

If the electrode finger pitch in the inter-stage matching SAW resonator or resonators is more narrow than the electrode finger pitch in the series-arm SAW resonator, one or more additional poles of attenuation are produced in the upper stopband of the SAW filter, increasing the upper stopband attenuation and width.

DETAILED DESCRIPTION OF THE INVENTION

Embodiments of the invention will be described with reference to the attached illustrative drawings, following a further description of the prior art and the problems addressed by the invention.

Figure 1:
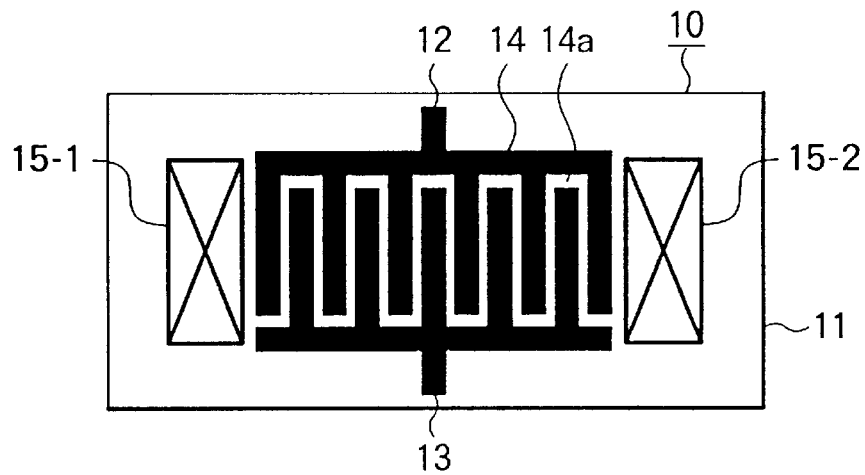
FIG. 1 shows a plan view of a SAW resonator.

FIG. 1 shows a SAW resonator 10 having a piezoelectric substrate 11 made of, for example, lithium tantalate ($LiTaO_3$), lithium niobate ($LiNbO_3$), or crystalline quartz. A metal film is deposited on the piezoelectric substrate 11 and patterned to form an input terminal 12, an output terminal 13, an interdigital transducer 14 with a plurality of electrode fingers 14a, and a pair of reflectors 15-1 and 15-2, disposed on both sides of the interdigital transducer 14. The reflectors 15-1 and 15-2 may be omitted if they are not needed.

Figure 2A:
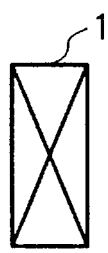
FIGS. 2A, 2B, and 2C show the reflector symbol and two types of reflectors that can be employed in FIG. 1.
Figure 2B:
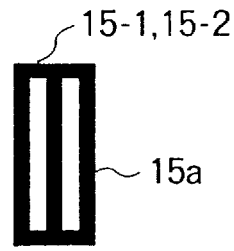
Figure 2C:

The general symbol for a reflector, illustrated separately in FIG. 2A, may denote various types of reflectors; the two main types are shown in FIGS. 2B and 2C. The reflector in FIG. 2B has, for example, fifty to one hundred electrode fingers 15a which are interconnected so that the entire reflector is short-circuited. The reflector in FIG. 2C is similar except that the electrode fingers 15a are completely disconnected from one another; the electrode fingers are open-circuited. Both types of reflectors affect SAW filter characteristics in substantially the same way.

When present, the reflectors 15-1 and 15-2 can be placed at various distances from the interdigital transducer 14 in order to obtain a desired impedance. The general practice is to place the reflectors so that the distance between the center lines of the electrode 14a disposed at one end of the interdigital transducer 14 and the electrode finger 15a disposed at the adjacent end of the reflector is substantially one-half the wavelength of the surface acoustic wave excited by the interdigital transducer 14.

The interdigital transducer 14 and reflectors 15-1 and 15-2 are formed in the same fabrication process step, so they have the same film thickness, and are made of the same material. The film thickness is typically form a few hundred angstroms to a few thousand angstroms. The film material is usually aluminum, or an alloy having aluminum as its principal component, but films of hold or titanium, or of an alloy having one of these metals as the principal component, are also employed.

Figure 3:
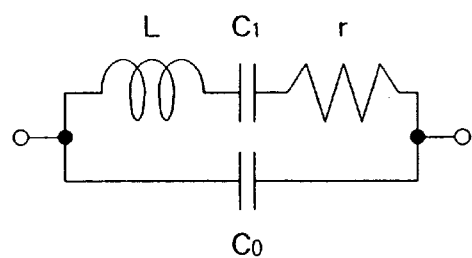
FIG. 3 is an equivalent electrical circuit diagram of the SAW resonator in FIG. 1.
Figure 4:
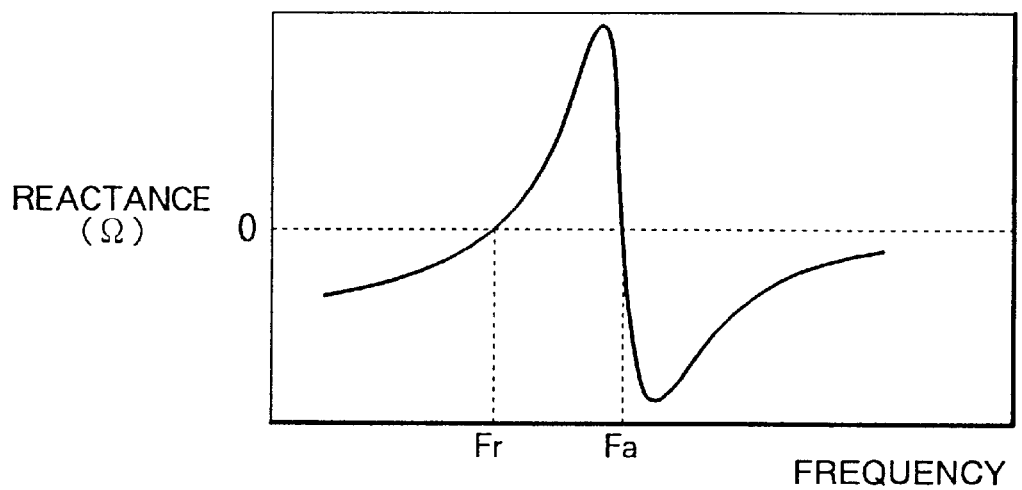
FIG. 4 illustrates the reactance characteristic of the equivalent circuit in FIG. 3.

FIG. 3 shows an equivalent LC circuit commonly used to approximate the characteristics of the SAW resonator 10. The circuit comprises an inductor L, a capacitor $C_1$, and a resistor r coupled in series, and another capacitor $C_0$ coupled in parallel with the L, $c_1$, and r elements. This circuit has the reactance characteristic shown in FIG. 4, in which frequency is indicated (in hertz) on the horizontal axis, and reactance (in ohms) on the vertical axis. Fr is the resonant frequency, at which the circuit as a whole has a very low impedance. Fa is the antiresonant frequency, at which the impedance is very high. The design of electrical filters from elements having this type of reactance characteristic is a well-established art.

Figure 5A:
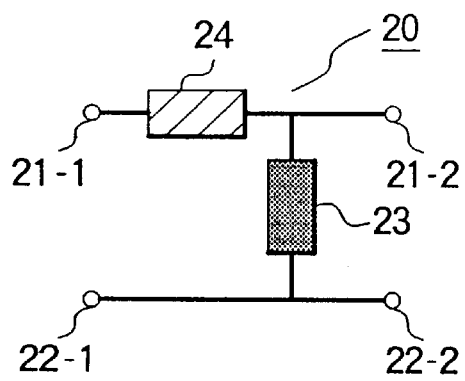
FIGS. 5A and 5B show two single-stage resonator-type filters with a ladder circuit configuration.
Figure 5B:
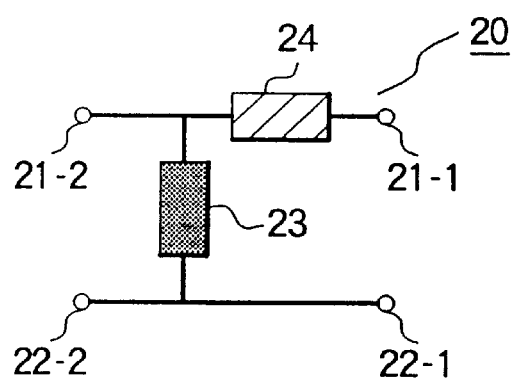

FIGS. 5A and 5B show two basic filter configurations using resonators of the above type. Both filters are single-stage ladder networks 20 with input terminals 21-1 and 22-1, output terminals 21-2 and 22-2, a shunt-arm resonator 23, and a series-arm resonator 24. The input impedance of the filter in FIG. 5A is equal to the output impedance of the filter in FIG. 5B, and the output impedance of the filter in FIG. 5A is equal to the input impedance of the filter in FIG. 5B. These impedance equalities are significant when filter sections with the configurations shown in FIGS. 5A and 5B are cascaded to form a multiple-stage filter.

If the antiresonant frequency of the shunt-arm resonator 23 is substantially equal to the resonant frequency of the series-arm resonator 24, the single-stage ladder network shown in FIG. 5A or FIG. 5B functions as a bandpass filter. This condition also leads to good impedance matching between the input terminals 21-1 and 22-1 and output terminals 21-2 and 22-2.

Figure 6:
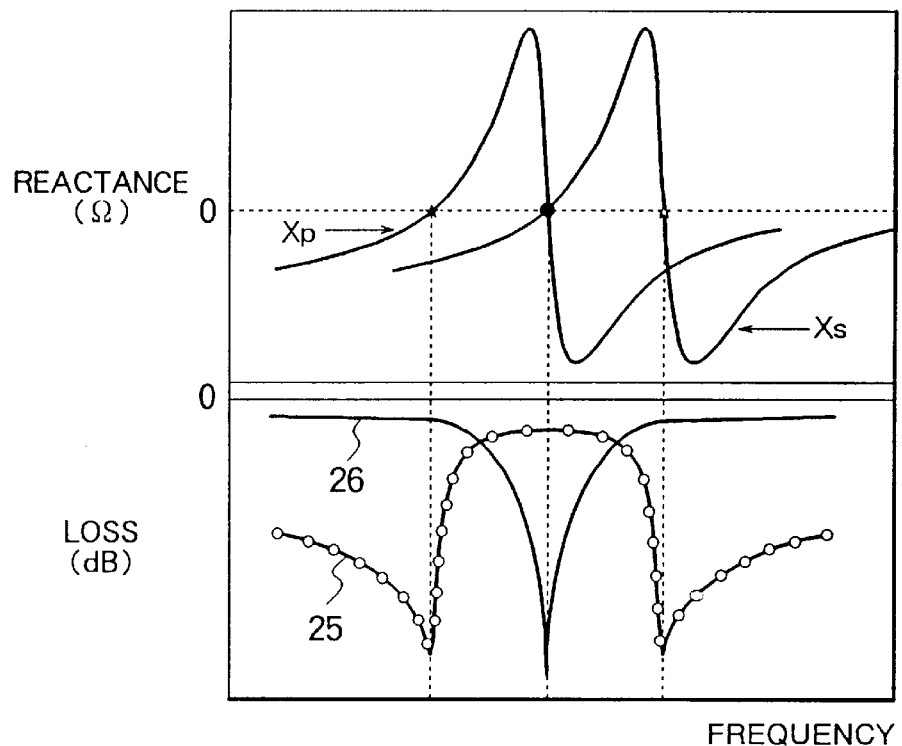
FIG. 6 shows reactance and loss characteristics of the filters in FIGS. 5A and 5B.

FIG. 6 shows the reactance characteristics of the resonators 23 and 24 and the loss characteristics of the ladder network 20 in FIGS. 5A and 5B when this condition is met. Frequency (in hertz) is shown on the horizontal axis, reactance (in ohms) on the upper part of the vertical axis, and loss (in decibels) on the lower part of the vertical axis. In the upper part of the graph, Xp denotes the reactance characteristic of the shunt-arm resonator 23, and Xs denotes the reactance characteristic of the series-arm resonator 24. The black star denotes the resonant frequency of the shunt-arm resonator 23. The black dot denotes the antiresonant frequency of the shunt-arm resonator 23, which is also the resonant frequency of the series-arm resonator 24. The white star denotes the antiresonant frequency of the series-arm resonator 24. In the lower part of the graph, the curve 25 adorned with white dots is the insertion loss characteristic, and the unadorned curve 26 is the reflection loss characteristic. The insertion loss characteristic 25 is that of a bandpass filter with a passband extending above and below the resonant frequency of the series-arm resonator 24.

If the number of stages in the ladder network is increased, the attenuation in the upper and lower stopbands increases, but the insertion loss in the passband also increases. The number of stages is accordingly determined by the required filter characteristics. As the number of stages increases, the number of resonators 23 and 24 increases proportionally.

Figure 7:
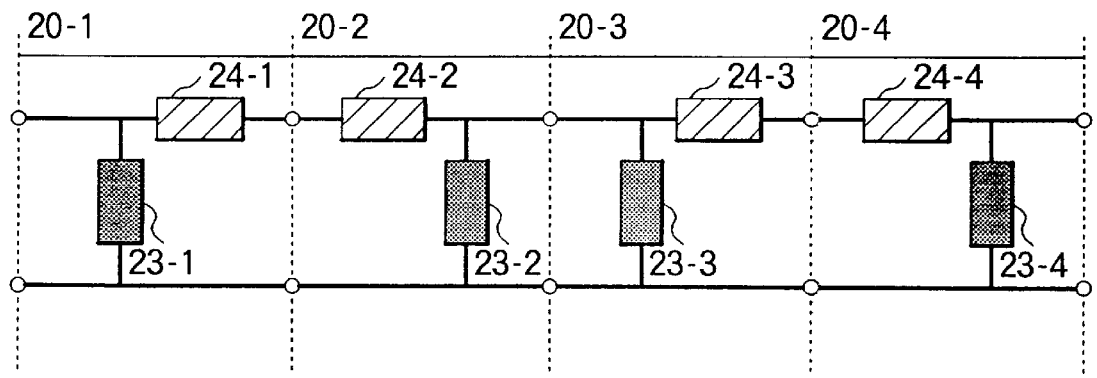
FIG. 7 shows a conventional four-stage resonator-type filter with a ladder configuration.

FIG. 7 shows a preliminary design of a conventional four-stage resonator-type ladder filter. This design cascades four ladder stages 20-n of the type shown in FIGS. 5A and 5B, each stage 20-n comprising a shunt-arm resonator 23-n and a series-arm resonator 24-n (n=1, 2, 3, 4). As shown, the design requires eight resonators.

To prevent signal reflection between stages, the stages are arranged so that terminals with equal impedance are interconnected. As a result, shunt-arm resonators 23-2 and 23-3 are coupled in parallel at the same point in the ladder network. Similarly, series-arm resonators 24-1 and 24-2 are coupled in series at the same point; likewise, resonators 24-3 and 24-4 are coupled in series at the same point.

Figure 8:
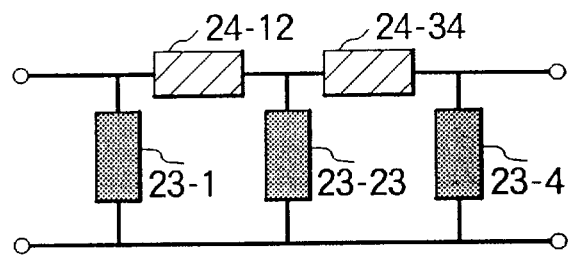
FIG. 8 shows another conventional four-stage resonator-filter with a ladder configuration.

Two adjacent resonators that are coupled in series or parallel can generally be combined into a single resonator having substantially the same impedance characteristics as the series or parallel circuit made up of the two resonators. Such combinations simplify the filter in FIG. 7 to the configuration shown in FIG. 8, having only five resonators. Resonator 24-12 in FIG. 8 is equivalent to the combination of resonators 24-1 and 24-2 in FIG. 7; resonator 24-34 in FIG. 8 is equivalent to the combination of resonators 24-3 and 24-4 in FIG. 7; resonator 23-23 in FIG. 8 is equivalent to the combination of resonators 23-2 and 23-3 in FIG. 7; and resonators 23-1 and 23-4 in FIG. 8 are the same as resonators 23-1 and 23-4 in FIG. 7.

When SAW resonators are used, two resonators can be combined into one by the following technique.

Figure 9:
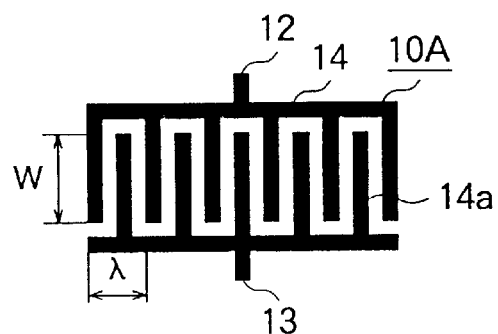
FIG. 9 shows a SAW resonator of aperture W.

FIG. 9 shows a singe conventional SAW resonator 10A having an input terminal 12, an output terminal 13, and an interdigital transducer 14 with electrode fingers 14a. Reflectors may be present, but they have been omitted to simplify the drawing. The parameter W is the width of the interdigital part of the electrode fingers 14a, referred to as the aperture of the interdigital transducer 14. The parameter $\lambda$, equal to twice the spacing between the center lines of adjacent electrode fingers, is the wavelength of the surface acoustic wave excited by the interdigital transducer 14.

Figure 10:
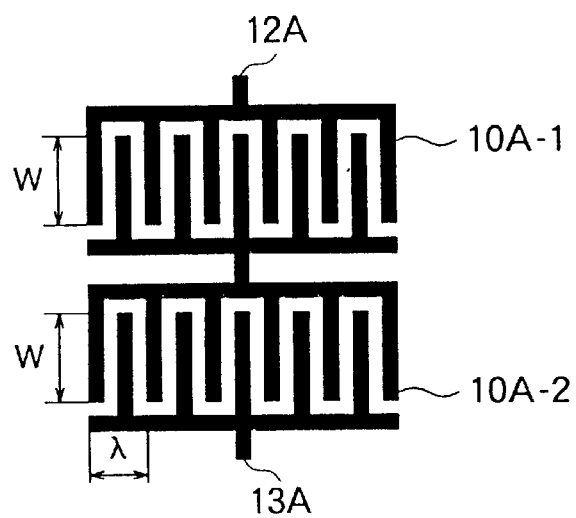
FIG. 10 shows two SAW resonators of aperture W coupled in series.
Figure 11:
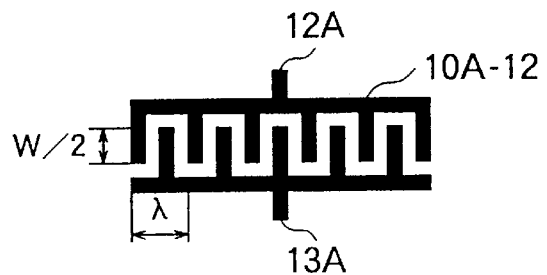
FIG. 11 shows a combined SAW resonator equivalent to the two SAW resonators in FIG. 10.

When two of these SAW resonators 10A-1 and 10A-2 are coupled in series as shown in FIG. 10, they can be combined into a single SAW resonator 10A-12 having half the aperture (W/2), as shown in FIG. 11. When the same two SAW resonators 10A-1 and 10A-2 are coupled in parallel as shown in FIG. 12, they can be combined into a single SAW resonator 10A-12 having twice the aperture (2W), as shown in FIG. 13.

This techniques works because the impedance characteristics of the SAW resonators 10A-1 and 10A-2 dominated by the static capacitance of their electrode fingers 14a. If two capacitors of equal capacitance C are coupled in series, their combined capacitance is C/2, while if they are coupled in parallel, their combined capacitance is 2C. Similarly, the SAW resonator 10A-12 in FIG. 11 has half the static capacitance of the SAW resonator 10A in FIG. 9, while the SAW resonator 10A-12 in FIG. 13 has twice the static capacitance of the SAW resonator 10A in FIG. 9.

Figure 12:
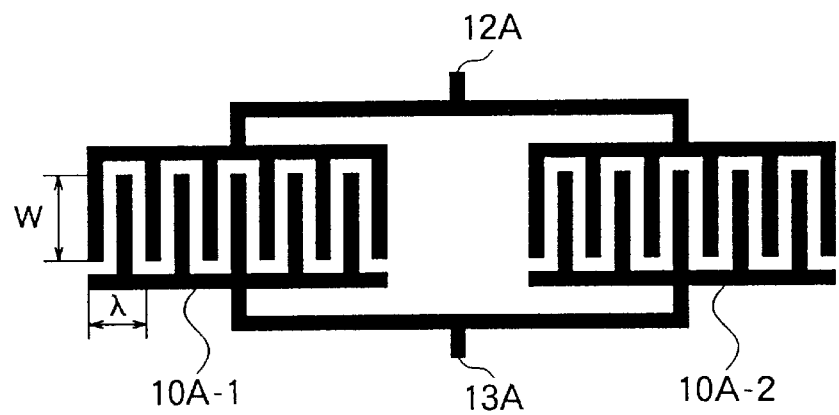
FIG. 12 shows two SAW resonators of aperture W coupled in parallel.
Figure 13:
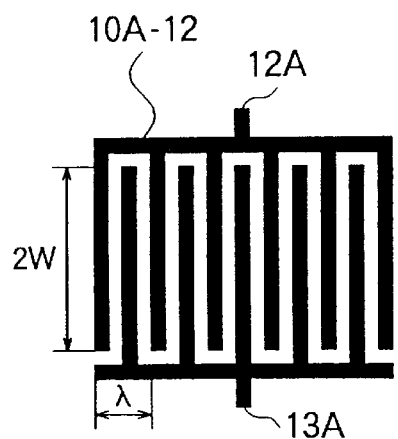
FIG. 13 shows a combined SAW resonator equivalent to the two SAW resonators in FIG. 12.

This technique for combining SAW resonators is not exact, but it has been experimentally confirmed that the SAW resonator in FIG. 11 has substantially the same impedance characteristic as the two SAW resonators in FIG. 10, and that the SAW resonator in FIG. 13 has substantially the same impedance characteristic as the two SAW resonators in FIG. 12.

The four-stage ladder filter in FIG. 8, which uses only five SAW resonators, can accordingly be given impedance characteristics and transmission characteristics substantially identical to those of the larger four-stage filter in FIG. 7. In general, the number of SAW resonators required in a resonator-type SAW filter is roughly equal to the number of ladder stages. It is also true that the stopband attenuation increases substantially in proportion to the number of ladder stages, so when the desired filter characteristics have been determined, the number of stages is also determined, as noted earlier.

Figure 14:
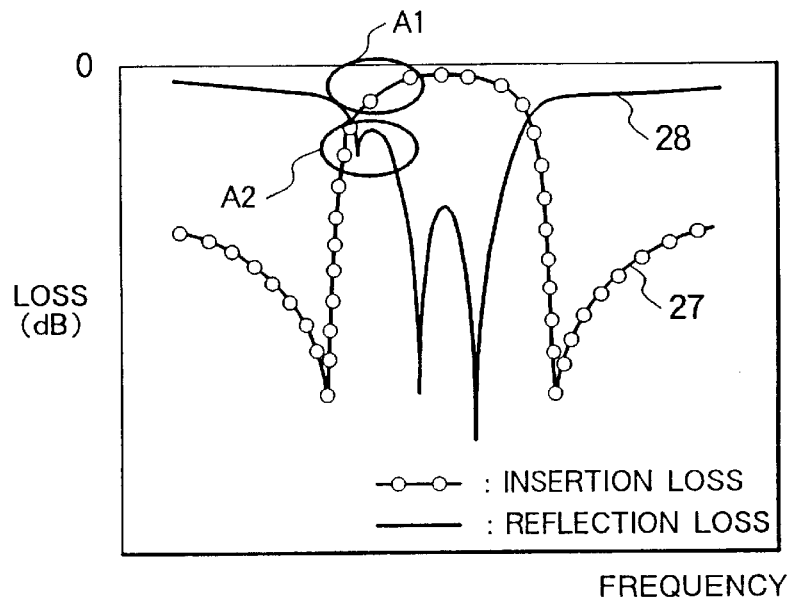
FIG. 14 illustrates loss characteristics of a conventional resonator-type SAW filter having the configuration shown in FIG. 8.

FIG. 14 illustrates the transmission characteristics (insertion loss and reflection loss) of a resonator-type SAW filter having the ladder configuration shown in FIG. 8. The horizontal axis indicates frequency, the vertical axis indicates loss in decibels, the insertion loss characteristic is indicated by curve 27, and the reflection loss characteristic is indicated by curve 28. The problem areas are area A1, where the insertion loss characteristic is degraded by an asymmetric slump, and area A2, where the reflection loss characteristic is degraded by an unwanted uprising. Both problems are indicative of an unwanted loss due to impedance mismatching between stages.

Although the problem areas are confined to the low-frequency end of the passband, that does not mean that they can be ignored. Insertion loss characteristics are generally specified in terms of the maximum insertion loss in the passband, so a high loss at the low-frequency end cannot be offset by a low loss at the high-frequency end. The less variation or ripple there is in the insertion loss characteristic over the entire passband, the better.

The insertion-loss problem in area A1 can be analyzed as follows.

When a resonator-type SAW filter has only one ladder stage, as in FIGS. 5A and 5B, the insertion loss characteristic is nearly symmetrical, as shown in FIG. 6, but when more stages are added, the insertion loss curve begins to tilt down at the low-frequency end, at an angle that becomes increasingly steep with increasing numbers of stages. The cause of the problem therefore appears to lie in the coupling between stages.

Experiments and simulations further suggest that the problem arises from the occurrence of a $\pi$-type section in the ladder network. The insertion loss characteristic of a two-stage filter is degraded if the ladder network has a $\pi$-type configuration, but is not degraded if the ladder network has a T-type configuration. A ladder network with three or more stages always includes a $\pi$-type section, and always shows degradation of the insertion loss characteristic at the low-frequency end of the passband.

Figure 15:
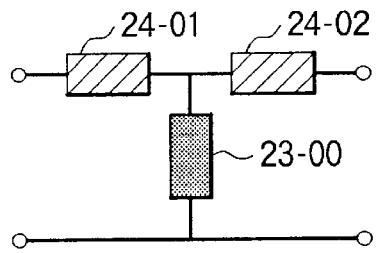
FIG. 15 illustrates a two-stage resonator-type SAW filter having a T-type configuration.

FIG. 15 shows a two-stage ladder network of the T type, comprising three SAW resonators 23-00, 24-01, and 24-02. The two series-arm SAW resonators 24-01 and 24-02 have the same configuration, both being equivalent to any one of the resonators 24-1, 24-2, 24-3, and 24-4 in FIG. 7. The shunt-arm SAW resonator 23-00 is equivalent to the combination of the two resonators 23-2 and 23-3 in FIG. 7, or to resonator 23—23 in FIG. 8.

Figure 16:
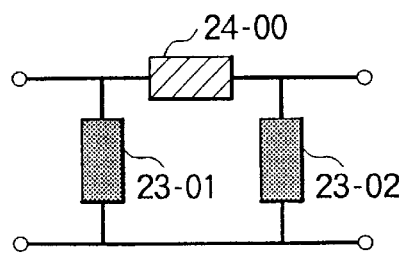
FIG. 16 illustrates a two-stage resonator-type SAW filter having a π-type configuration.

FIG. 16 shows a two-stage ladder network of the $\pi$ type, comprising three SAW resonators 23-01, 23-02, and 24-00. The two shunt-arm SAW resonators 23-01 and 23-02 have the same configuration, both being equivalent to resonators 23-1, 23-2, 23-3, and 23-4 in FIG. 7. The series-arm SAW resonator 24-00 is equivalent to the combination of the two resonators 24-1 and 24-2 (or 24-3 and 24-4) in FIG. 7, or to resonator 24-12 or (24-34) in FIG. 8.

A comparison of FIGS. 15 and 16 suggests that the cause of degradation in the insertion loss characteristic lies at the point at which the left and right sides of a $\pi$-type network are interconnected, namely in the series-arm SAW resonator 24-00 in FIG. 16.

In general, when arbitrary two-port electrical networks are interconnected, to minimize the loss due to inter-stage reflection and reduce insertion loss, the impedance values of the two networks, as seen from the interconnected terminals, should be mutually conjugate. In the design of conventional resonator-type SAW filters, however, this point has been generally overlooked. Terminals with equal impedance values have been interconnected, to reduce inter-stage reflection, a practice which is theoretically incorrect.

Figure 17:
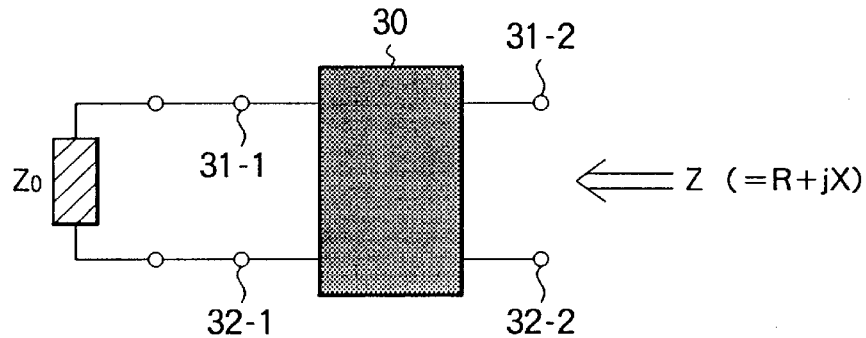
FIG. 17 illustrates a two-port electrical network terminated with a characteristic impedance $Z_0$.

FIG. 17 shows an arbitrary two-port electrical network 30 having input terminals 31-1 and 32-1 and output terminals 31-2 and 32-2. The input terminals 31-1 and 32-1 are terminated with a characteristic impedance $Z_O$. The impedance Z seen from the output terminals 31-2 and 32-2 can be expressed as R+jX, where R is a resistance, X is a reactance, and j is a complex number equal to the square root of minus one.

Figure 18:
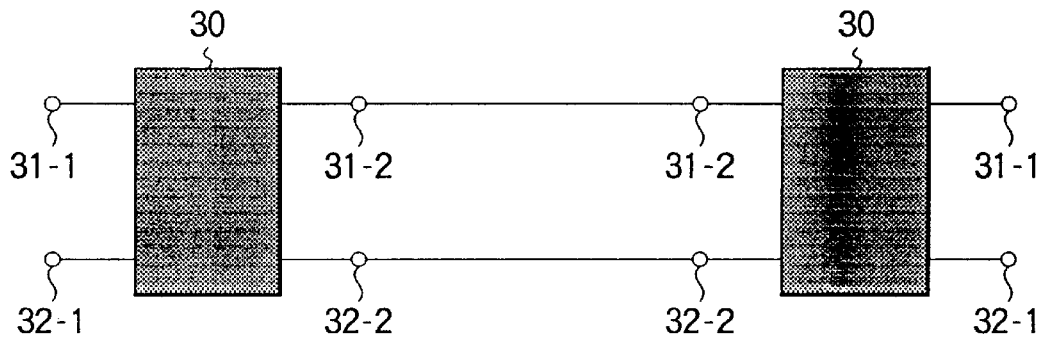
FIG. 18 illustrates a cascaded pair of two-port electrical networks.

FIG. 18 shows a pair of two-port electrical networks 30 cascaded in the manner of a conventional resonator-type SAW filter, simply by interconnecting their output terminals 31-2 and 32-2. As seen from the interconnected terminals 31-2 and 32-2, both networks 30 have the same impedance (R+jX), so their impedances are not mutually conjugate, and a mismatching loss is unavoidable.

According to interconnection theory, if the impedance of one two-port electrical network 30 as seen from terminals 31-2 and 32-2 is R+jX, the other two-port electrical network should have the conjugate impedance R−jX. If this conjugate impedance matching condition is satisfied, the reactance components of the two impedances will cancel, and mismatching loss will be minimized.

Figure 19:
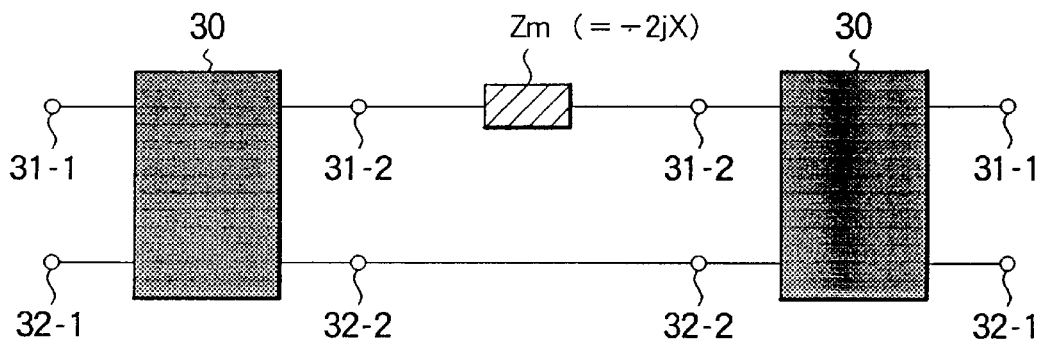
FIG. 19 shows a cascaded pair of two-port electrical networks with an impedance Zm inserted for matching purposes, illustrating a basic concept of the present invention.

FIG. 19 shows a way to satisfy this condition when both two-port electrical networks 30 have the same impedance R+jX, as seen from their output terminals 31-2 and 32-2. An impedance Zm is coupled in series with the two output terminals 31-2. Zm is a pure reactance, with an impedance value of −2jX. The impedance seen from each pair of output terminals 31-2 and 32-2 is accordingly R−jX in the direction looking toward Zm, and R+jX in the opposite direction. This is the approach taken in the present invention.

The ideal value of Zm is −2jX, but in practice, the mismatching loss can be reduced by any value of Zm reasonably close to −2jX. The problem in FIG. 18 is that the cascaded network has twice the reactance (2jX) of each of the two-port electrical networks 30 taken individually (jX). Any value of Zm in FIG. 19 that reduces this reactance from 2jX to a smaller value will alleviate the problem.

First Embodiment

Figure 20:
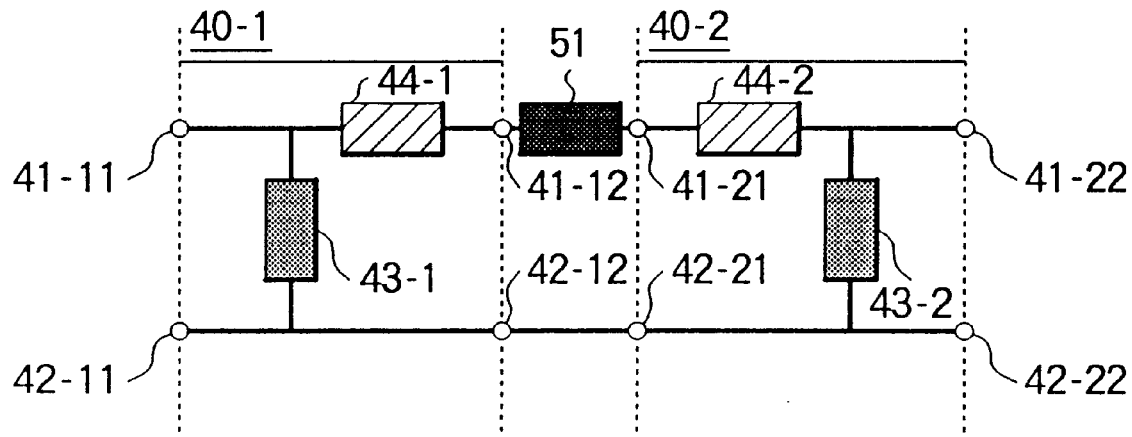
FIG. 20 is a schematic diagram of a two-stage resonator-type SAW filter illustrating a first embodiment of the invention.

Referring to FIG. 20, a first embodiment of the invention is a two-stage resonator-type SAW filter with a π-type ladder network configuration. The first ladder stage 40-1 has input terminals 41-11 and 42-11, output terminals 41-12 and 42-12, a shunt-arm SAW resonator 43-1 coupled between the input terminals 41-11 and 42-11, and a series-arm SAW resonator 44-1 coupled between terminals 41-11 and 41-12. The second ladder stage 40-2 has input terminals 41-21 and 42-21, output terminals 41-22 and 42-22, a shunt-arm SAW resonator 43-2 coupled between the output terminals 41-22 and 42-22, and a series-arm SAW resonator 44-2 coupled between terminals 41-21 and 41-22. The SAW resonators 43-1, 43-2, 44-1, and 44-2 are similar to the conventional SAW resonator shown in FIG. 1, or in FIG. 9. The two shunt-arm SAW resonators 43-1 and 43-2 are identical to one another, and have equal impedance values. Similarly, the two series-arm SAW resonators 44-1 and 44-2 are identical to one another and have equal impedance values.

A novel feature of the first embodiment is that an inter-stage matching SAW resonator 51 is coupled in series with terminals 41-12 and 41-21. The inter-stage matching SAW resonator 51 reduces the mismatching loss between the two ladder stages by reducing the combined reactance of the two cascaded ladder stages 40-1 and 40-2, a explained in FIG. 19.

If the first-stage input terminals 41-11 and 42-11 and the second-stage output terminals 41-22 and 42-22 are terminated with a characteristic impedance $Z_O$, the impedance of the first ladder stage 40-1 as seen from terminals 41-12 and 42-12 is exactly equal to the impedance of the second ladder stage 40-2 as seen from terminals 41-21 and 42-21, with a fairly high inductive reactance value in the low-frequency part of the passband. In the rest of the passband, the reactance may be inductive, or it may be capacitive, but its absolute value will be smaller than the absolute value of the reactance at the low-frequency end of the passband, by more than a factor of ten. This is why, if the first ladder stage 40-1 and second ladder stage 40-2 were to be interconnected in the conventional manner, degradation of the insertion loss characteristic would occur near the low-frequency end of the passband and not in other parts.

The inter-stage matching SAW resonator 51 should accordingly have an impedance with a capacitive reactance component in the low-frequency part of the passband, the absolute value of the reactance being substantially equal to the sum of the absolute values of the reactances of the two stages 40-1 and 40-2 in this part of the passband. In other parts of the passband, the inter-stage matching SAW resonator 51 should have a reactance with a smaller absolute value. The resistive component of the impedance of the inter-stage matching SAW resonator 51 should be as small as possible.

It is not easy to find a conventional impedance element satisfying these conditions. They might possibly be satisfied by a combination of different impedance elements, but the resulting configuration would be large, complex, and impractical. In studying the impedance characteristics of the SAW resonators 44-1 (or 44-2) and 43-1 (43-2), however, the inventor has found that near the low-frequency end of the passband of the filter, the reactance is capacitive, and that if certain steps are taken, a SAW resonator similar to one of the SAW resonators 44-1, 44-2, 43-1, and 43-2 can be used as the inter-stage matching SAW resonator 51.

The inter-stage matching SAW resonator 51 is preferably similar to the series-arm SAW resonator 44-1 (or 44-2). If the inter-stage matching SAW resonator 51 has substantially the same resonant and antiresonant frequencies as the series-arm SAW resonators 44-1 and 44-2, it can be inserted in series with these SAW resonators 44-1 and 44-2 without having any large unwanted effects on the transmission characteristics of the filter. In the description below, the configuration of the inter-stage matching SAW resonator 51 will accordingly be based on the configuration of SAW resonator 44-1. In particular, the interdigital transducer in the inter-stage matching SAW resonator 51 will have the same number of electrode fingers, with the same pitch, as the interdigital transducer in the series-arm SAW resonator 44-1.

In the following description, the term 'pitch' will always refer to electrode finger pitch.

As explained above, consideration of the reactance components of the first and second ladder stages 40-1 and 40-2 in the low-frequency part of the passband leads to the conclusion that the impedance of the inter-stage matching SAW resonator 51 should be equivalent to the sum of the impedances of the two series-arm SAW resonators 44-1 and 44-2; that is, the inter-stage matching SAW resonator 51 should be equivalent to the series combination of the two SAW resonators 44-1 and 44-2. Since these two SAW resonators 44-1 and 44-2 are identical, the inter-stage matching SAW resonator 51 should be equivalent to two copies of the series-arm SAW resonator 44-1, coupled in series. The technique for combining SAW resonators described above indicates if the series-arm SAW resonator 44-1 has an interdigital transducer with aperture $W_1$, the inter-stage matching SAW resonator 51 should be substantially identical to the series-arm SAW resonator 44-1, except that the aperture of its interdigital transducer should be $W_1/2$.

Since the electrode fingers in the two series-arm SAW resonators 44-1 and 44-2 and the inter-stage matching SAW resonator 51 all have the same pitch, further combinations of these resonators are possible. For example, series-arm SAW resonator 44-1 and inter-stage matching SAW resonator 51 can be combined into a single SAW resonator, or all three SAW resonators 44-1, 44-2, and 51 can be combined into a single SAW resonator. If all three resonators 44-1, 44-2, and 51 are combined into a single SAW resonator, however, the resulting SAW resonator may not have exactly the desired impedance characteristics, so some adjustment of the number of electrode fingers or the aperture may be necessary.

Next, the operation of the first embodiment will be described.

When a high-frequency signal is received at input terminals 41-11 and 42-11 in FIG. 20, voltage differences are generated between electrode fingers in the interdigital transducers of all of the SAW resonators 43-1, 43-2, 44-1, 44-2, and 51, and surface acoustic waves are excited, causing these SAW resonators 43-1, 43-2, 44-1, 44-2, and 51 to display impedance characteristics similar to those of a crystal resonator or a conventional LC resonator. The entire ladder network comprising these SAW resonators displays the characteristics of a bandpass filter.

The novel inter-stage matching SAW resonator 51 disposed in series with the first ladder stage 40-1 and second ladder stage 40-2 corrects the transmission characteristic in the low-frequency part of the passband, thereby reducing the difference between the maximum and minimum values of the insertion loss characteristic in the passband. The result if a flatter passband characteristic with a more uniform insertion loss. Signals having frequencies within the passband are output with substantially uniform intensity at the output terminals 41-22 and 42-22, while signals having frequencies outside the passband are reflected at the input terminals 41-11 and 42-11 and are not output at the output terminals 41-22 and 42-22.

Figure 21:
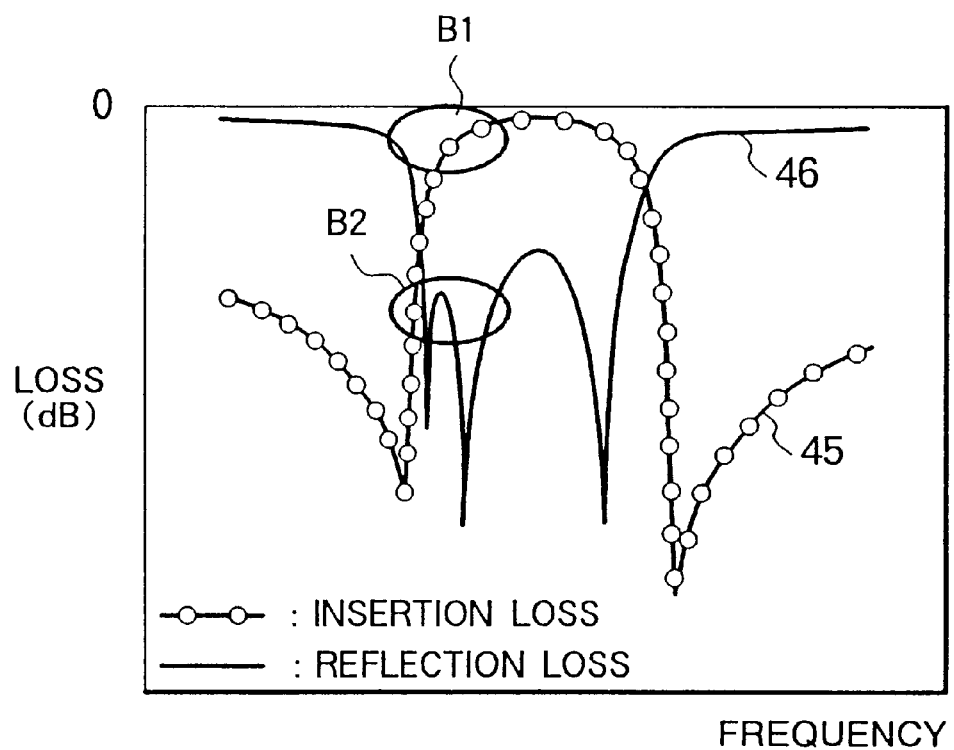
FIG. 21 illustrates loss characteristics of the SAW filter in FIG. 20.

FIG. 21 shows the effect of the first embodiment. The horizontal and vertical axes indicate frequency in hertz and loss in decibels, respectively. Curve 45 is the insertion loss characteristic; curve 46 is the reflection loss characteristic. If the areas B1 and B2 are compared with the corresponding areas A1 and A2 in FIG. 14, it becomes apparent that the insertion loss characteristic of the first embodiment is not degraded in area B1 as was the conventional characteristic in area A1, and the reflection loss characteristic in area B2 has been greatly improved. This is indicative of good impedance matching conditions between the two stages of the filter.

The improved insertion loss characteristic in the low-frequency part of the passband reduces the passband ripple and improves the insertion loss rating of the filter. At present, despite their weight, bulk, and cost, dielectric filters are still being used in mobile telephone sets such as automobile telephone sets and portable telephone sets, particularly in the antenna duplexer circuits of these telephone sets. The improvement in transmission characteristics achieved by the first embodiment should enable the use of SAW filters in all parts of these mobile telephone sets, markedly reducing their size and cost and improving their performance. The improved transmission characteristics also make the first embodiment suitable for a variety of other applications in which conventional SAW filters cannot easily be used.

Figure 22:
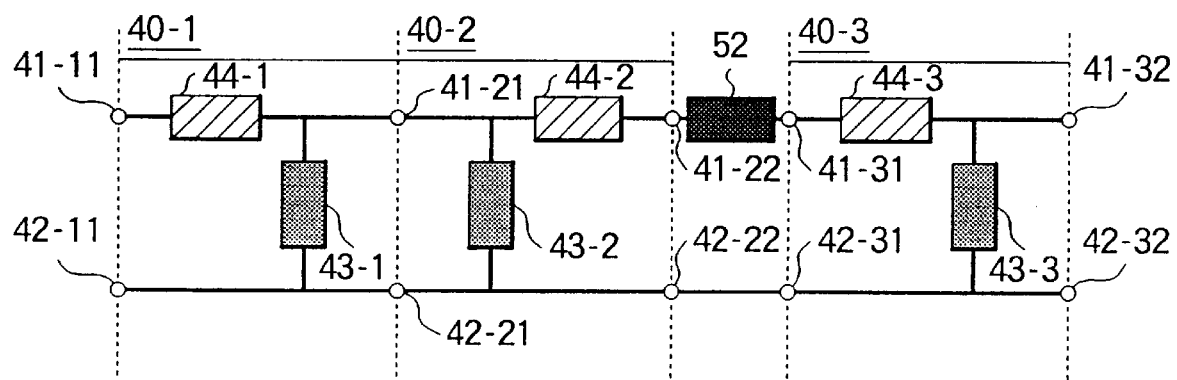
FIG. 22 is a schematic diagram of a three-stage resonator-type SAW filter illustrating a variation of the first embodiment.

FIG. 22 shows a variation of the first embodiment, having three stages instead of two.

The first ladder stage 40-1 comprises terminals 41-11, 42-11, 41-21, and 42-21, a shunt-arm SAW resonator 43-1, and a series-arm SAW resonator 44-1. The second ladder stage 40-2 comprises terminals 41-21, 42-21, 41-22, and 42-22, a shunt-arm SAW resonator 43-2, and a series-arm SAW resonator 44-2. The third ladder stage 40-3 comprises terminals 41-31, 42-31, 41-32, and 42-32, a shunt-arm SAW resonator 43-3, and a series-arm SAW resonator 44-3. The three shunt-arm SAW resonators 43-1, 43-2, and 43-3 have identical pitches and identical impedance characteristics. The series-arm SAW resonators 44-1, 44-2, and 44-3 likewise have identical pitches and identical impedance characteristics. All three series-arm SAW resonators 44-1, 44-2, and 44-3 have the same aperture $W_1$.

Shunt-arm SAW resonators 43-1 and 43-2 can be combined into a single SAW resonator by the technique shown in FIGS. 12 and 13, and SAW resonators 44-2 and 44-3 can be combined into a single SAW resonator by the technique shown in FIGS. 10 and 11, but to simplify the description, these combination will not be made here.

The second and third ladder stages 40-2 and 40-3 form a π-type section in the ladder network, so to correct the impedance mismatching that occurs between terminals 41-22 and 42-22 and terminals 41-31 and 42-31, an inter-stage matching SAW resonator 52 is coupled between terminals 41-22 and 41-31. This SAW resonator 52 has the same pitch as the series-arm SAW resonators 44-1, 44-2, and 44-3. If the number of electrode fingers is also the same, the aperture can be determined as follows.

If terminals 41-11 and 42-11 are terminated with a characteristic impedance $Z_0$, the impedance of the part of the filter circuit to the left of terminals 41-22 and 42-22, comprising the first and second stages 40-1 and 40-2, as seen from these tow terminals 41-22 and 42-22, can be expressed as $Z_1$ (=$R_1+jX_1$). If terminals 41-32 and 42-32 are terminated with a characteristic impedance $Z_0$, the impedance of the part of the filter to the right of terminals 41-31 and 42-31, comprising the third stage 40-3, as seen from these two terminals 41-31 and 42-31, can be expressed as $Z_2$ (=$R_2+jX_2$).

To minimize the mismatching loss, the inter-stage matching SAW resonator 52 should have as small a resistive impedance component as possible in the passband, and its reactance should be substantially equal to $-j(X_1+X_2)$. Given that SAW resonator 52 has the same number of electrode fingers as SAW resonator 44-1, the aperture of SAW resonator 52 should be substantially equal to $W_1 \times X_2/(X_1+X_2)$. This formula is derived from the static capacitance ratio of the interdigital transducers of SAW resonators 44-1 and 52, which is the inverse of their aperture ratio.

When the SAW filter has three stages or more, there may be more than one π-type section, and correction of the mismatching loss that occurs in the series arms of these π-type sections becomes more complex. The complexity can be reduced, however, by dividing the entire filter circuit into smaller parts, without dividing any of the π-type sections, each smaller part having just two or three stages. If inter-stage matching SAW resonators are added to the two-stage and three-stage parts in which a π-type section occurs, treating each such part separately as in FIG. 20 or FIG. 22, the transmission characteristics of the entire SAW filter will be improved. The first embodiment can accordingly be applied to any resonator-type SAW filter with a ladder network configuration.

Second Embodiment

Figure 23:
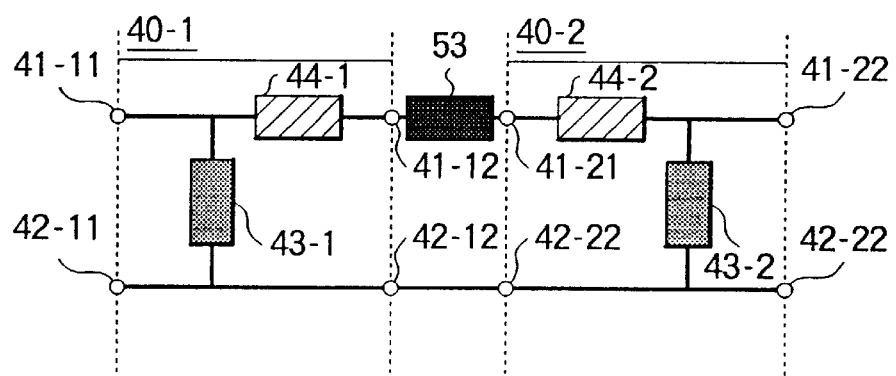
FIG. 23 is a schematic diagram of a two-stage resonator-type SAW filter illustrating a second embodiment of the invention.

Referring to FIG. 23, the second embodiment is a two-stage SAW filter having a first ladder stage 40-1 and second ladder stage 40-2 identical to the corresponding stages in the first embodiment. The same reference numerals are used for these stages as in FIG. 20. The configuration of the inter-stage matching SAW resonator 53, however, differs from the configuration of the inter-stage matching SAW resonator 51 in the first embodiment.

As in the first embodiment, the inter-stage matching SAW resonator 53 is designed with reference to series-arm SAW resonator 44-1. The difference is that the pitch of the electrode fingers is slightly more narrow in SAW resonator 53 than in SAW resonator 44-1. This difference shifts the resonant frequency and antiresonant frequency of the inter-stage matching SAW resonator 53 toward the high-frequency direction, preferably by an amount greater than one megahertz (1 MHz) but less than one hundred megahertz (100 MHz).

Because of the different pitch, the inter-stage matching SAW resonator 53 cannot be combined with the series-arm SAW resonators 44-1 and 44-2 by the technique illustrated in FIGS. 10 and 11.

The second embodiment operates in the same way as the first embodiment. The upward shift of the resonant and antiresonant frequencies of the inter-stage matching SAW resonator 53 alters the reactance component of the imped-ance of this SAW resonator 53 in the low-frequency portion of the passband of the SAW filter, but experiments have shown that if the shift is less than one hundred megahertz, the change in the reactance component is not large. Moreover, the change increases the reactance component, which is a capacitive reactance component. The second embodiment can accordingly be at least as effective as the first embodiment in reducing inter-stage mismatching loss and improving transmission characteristics in the low-frequency part of the passband.

In addition, the high-frequency shift of the antiresonant frequency of the inter-stage matching SAW resonator 53 produces a pole of attenuation in the upper stopband, at a frequency equal to that antiresonant frequency, thereby improving the attenuation performance of the filter in the upper stopband.

Figure 24:
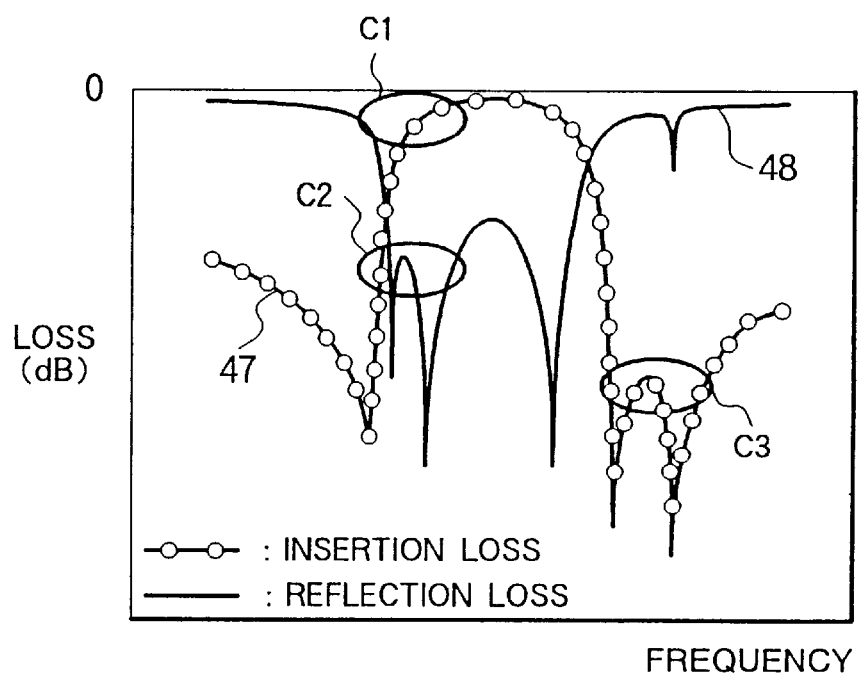
FIG. 24 illustrates loss characteristics of the SAW filter in FIG. 23.

The insertion loss and reflection loss characteristics of the second embodiment are illustrated in to FIG. 24, showing frequency in hertz on the horizontal axis and loss in decibels on the vertical axis. The insertion loss characteristic 47 and the reflection loss characteristic 48 have substantially the same form as in the first embodiment at the low-frequency end of the passband (areas C1 and C2 should be compared with areas B1 and B2 in FIG. 21). The transmission char-acteristics of the first and second embodiments are quite similar throughout the passband. In the upper stopband, however, the second embodiment shows a markedly greater insertion loss or attenuation in area C3, due to the additional pole of attenuation.

The second embodiment, like the first embodiment, is applicable in mobile telephone sets, but the enhanced attenu-ation performance in the upper stopband makes the second embodiment applicable in many kinds of telecommunication equipment, and other equipment, in which this type of strong adjacent-band attenuation is required.

The SAW filter shown in FIG. 23 is a two-stage filter, but the second embodiment can be adapted for use in SAW filters with three stages or more, by inserting an inter-stage matching SAW resonator 53 in each π-type section of the ladder network, as explained in the first embodiment. The pitch in each inter-stage matching SAW resonator 53 should be reduced, as compared with the first embodiment, to shift the impedance characteristics of the inter-stage matching SAW resonators 53 in the high-frequency direction.

Third Embodiment

Figure 25:
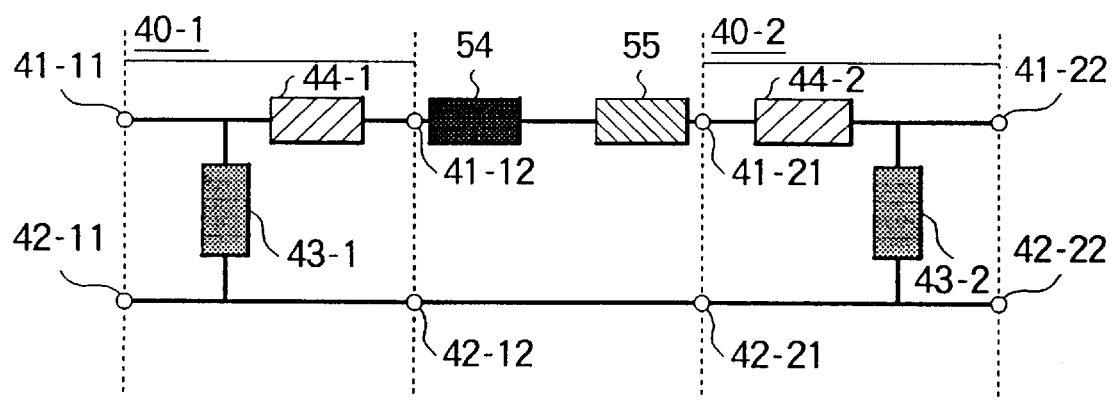
FIG. 25 is a schematic diagram of a two-stage resonator-type SAW filter illustrating a third embodiment of the invention.

Referring to FIG. 25, the third embodiment is a two-stage SAW filter with a π-type network configuration, having a first stage 40-1 and second stage 40-2 identical to the corresponding stages in the second embodiment, shown with the same reference numerals as in FIG. 23, but having two inter-stage matching SAW resonators 54 and 55. SAW resonators 54 and 55 are obtained by splitting the inter-stage matching SAW resonator 53 of the second embodiment into two SAW resonators having a combined static capacitance substantially equal to the static capacitance of that SAW resonator 53.

The splitting can be done in various ways, but for simplicity, in the following description, SAW resonators 54 and 55 will both be based on the configuration of series-arm SAW resonator 44-1. The combine impedance of SAW resonators 54 and 55 is equivalent to the impedance of two copies of SAW resonator 44-1 coupled in series, and is substantially equal to the impedance of the SAW resonator 53 in FIG. 23. The electrode finger pitch is slightly more narrow in SAW resonator 54 than in SAW resonator 44-1, shifting the impedance characteristic of SAW resonator 54 in the high-frequency direction. The pitch in SAW resonator 55 is slightly more narrow than the pitch in SAW resonator 54, shifting the impedance characteristic of SAW resonator 55 still further in the high-frequency direction.

The SAW resonator 53 is accordingly split into two SAW resonators 54 and 55 having different resonant frequencies, and different antiresonant frequencies. Compared with SAW resonator 44-1, the resonant and antiresonant frequencies of SAW resonator 54 are preferably shifted upward by several tens of megahertz. Compared with SAW resonator 54, the resonant and antiresonant frequencies of SAW resonator 55 are preferably shifted upward by several megahertz.

The third embodiment operates in the same way as the first and second embodiments. Shifting the impedance char-acteristics of the inter-stage matching SAW resonators 54 and 55 in the high-frequency direction has little effect on the reactance component of their characteristics. In reducing mismatching loss between stages, these two SAW resonators 54 and 55 have substantially the same effect as the inter-stage matching SAW resonator 51 in the first embodiment, and the inter-stage matching SAW resonator 53 in the second embodiment.

Figure 26:
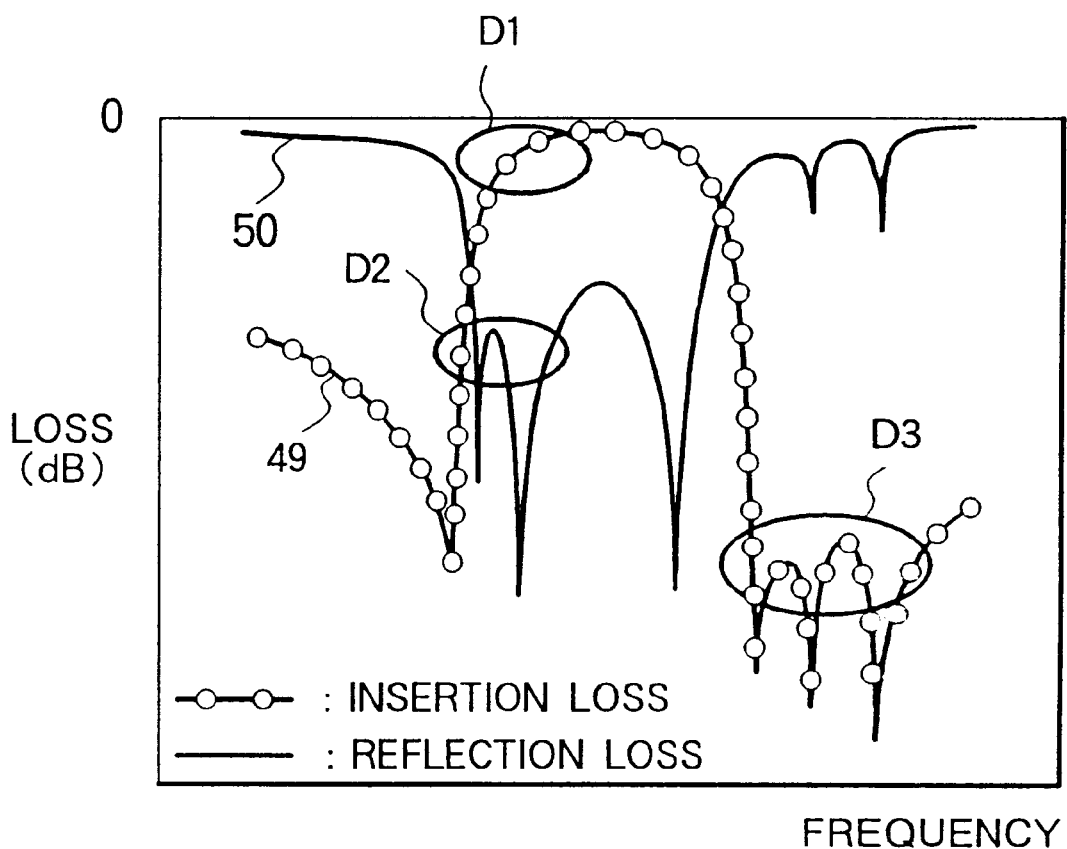
FIG. 26 illustrates loss characteristics of the SAW filter in FIG. 25.

This effect can be seen in areas D1 and D2 in FIG. 26, which shows the insertion loss characteristic 49 and reflec-tion loss characteristic 50 of the third embodiment. The horizontal and vertical axes represent frequency in hertz and loss in decibels, respectively.

In the upper stopband, two new poles of attenuation are produced, one at the antiresonant frequency of SAW resonator 54 and another at the antiresonant frequency of SAW resonator 55. Accordingly, attenuation in the upper stopband is greatly improved over the first embodiment, and is also significantly improved over the second embodiment, as shown in area D3 is FIG. 26. The width of the upper stopband is also increased; that is, the frequency range over which a certain minimum attenuation is attained is increased.

The third embodiment accordingly has excellent transmission characteristics for use in mobile telephone sets, and the location of the passband can be adjusted for use in many other types of telecommunication equipment.

The third embodiment can also be adapted for use in SAW filters with three stages or more, by inserting inter-stage matching SAW resonators 54 and 55 with reduced and mutually different pitches in each π-type section of the ladder network, as explained in the first embodiment.

As another variation of the third embodiment, the inter-stage matching SAW resonator 53 of the second embodiment can be split into three inter-stage matching SAW resonators, or more, all connected in series. The total series static capacitance of these inter-stage matching SAW resonators should remain substantially equal to the static capacitance of SAW resonator 53 in the second embodiment. Each inter-stage matching SAW resonator should have a different pitch, so that the impedance characteristics of the SAW resonators are shifted upward by different amounts, the largest shift still preferably being less than one hundred megahertz. Each inter-stage matching SAW resonator will then produce a pole of attenuation at a different frequency in the upper stopband; the number of poles produced will be equal to the number of inter-stage matching SAW resonators. In this way, the upper stopband can be further widened, and the depth of the attenuation in the upper stopband further increased.

As pointed out above, the embodiments shown in the drawings can be modified by increasing the number of stages, and by splitting or combining adjacent SAW resonators. Those skilled in the art will recognize that further variations are possible within the scope claimed below.

What is claimed is:

1. A resonator-type SAW filter having a plurality of SAW resonators with respective interdigital transducers formed on a single piezoelectric substrate, said SAW resonators being coupled in a ladder network configuration having at least one π-type section with a first ladder stage and a second ladder stage, said π-type section being formed by a series-arm SAW resonator and two shunt-arm SAW resonators, said π-type section also comprising:

an inter-stage matching SAW resonator coupled in series with said series-arm SAW resonator, said inter-stage matching SAW resonator also having an interdigital transducer, the interdigital transducer of said inter-stage matching SAW resonator and the interdigital transducer of said series-arm SAW resonator having substantially equal electrode finger pitches, said inter-stage matching SAW resonator reducing impedance mismatching between the first ladder stage and the second ladder stage of said π-type section.

2. The resonator-type SAW filter of claim 1, wherein the interdigital transducer of said inter-stage matching SAW resonator and the interdigital transducer of said series-arm SAW resonator have exactly equal electrode finger pitches.

3. The resonator-type SAW filter of claim 2, wherein said inter-stage matching SAW resonator and said series-arm SAW resonator are combined into a single SAW resonator.

4. A resonator-type SAW filter having a plurality of SAW resonators with respective interdigital transducers formed on a single piezoelectric substrate, said SAW resonators being coupled in a ladder network configuration having at least one π-type section with a first ladder stage and a second ladder stage, said π-type section being formed by a series-arm SAW resonator and two shunt-arm SAW reasontors, said sereis-arm SAW ersonator having a first resonant frequency and a first antiresonant frequency, the interdigital transducer in said series-arm SAW resonator having a first electrode finger pitch, said π-type section also comprising:

an inter-stage matching SAW resonator coupled in series with said series-arm SAW resonator, said inter-stage matching SAW resonator having a second resonant frequency and a second antiresonant frequency, said inter-stage matching SAW resonator having an interdigital transducer with a second electrode finger itch, said second electrode finger pitch being more narrow than said first electrode finger pitch, said second resonant frequency being higher than said first resonant frequency by a first amount, and second antiresonant frequency being higher than said first antiresonant frequency by a second amount substantially equal to said first amount, said inter-stage matching SAW resonator reducing impedance mismatching between the first ladder stage and the second ladder stage of said π-type section.

5. The resonator-type SAW filter of claim 4, wherein said first amount and said second amount are both greater than one megahertz but less than one hundred megahertz.

6. The resonator-type SAW filter of claim 4, wherein said π-type section has a plurality of inter-stage matching SAW resonators as described in claim 4, the interdigital transducers of said plurality of inter-stage matching SAW resonators having different electrode finger pitches, all more narrow than said first electrode finger pitch, said different electrode finger pitches causing the resonant frequencies of said plurality of inter-stage matching SAW resonators to be higher than said first resonant frequency by different third amounts and the antiresonant frequencies of said plurality of inter-stage matching SAW resonators to be higher than said first antiresonant frequency by different fourth amounts substantially equal to respective third amounts.

7. The resonator-type SAW filter of claim 6, wherein said third amounts and said fourth amounts are all greater than one megahertz but less than one hundred megahertz.

8. An improved SAW filter of the type that includes a piezoelectric substrate and a set of interdigital transducers on the substrate to provide a corresponding set of SAW resonators, the SAW resonators being connected in a ladder network configuration which includes a first ladder stage and a second ladder stage that is coupled to the first ladder stage to form a π-type section, the set of SAW resonators including a first shunt-arm resonator that is disposed in the first ladder stage, a second shunt-arm resonator that is disposed in the second ladder stage, and at least one series-arm resonator that is connected between the first and second shunt-arm resonators, wherein the improvement comprises:

means provided by the at least one series-arm resonators for reducing impedance mismatching between the first ladder stage and the second ladder stage of the π-type section.

9. The SAW filter of claim 8, wherein the SAW filter is a bandpass filter.

10. The SAW filter of claim 8, wherein the at least one series-arm resonator comprises a plurality of the SAW resonators in the set, so that a pluralty of sereis-arm resonators are connected between the first and second shunt-arm resonators.

11. The SAW filter of claim 10, wherein all of the series-arm resonators that are connected between the first and second shunt-arm resonators have the same electrode finger pitches.

12. The SAW filter of claim 10, wherein one of the series-arm resonators that are connected between the first and second shunt-arm resonators has an electrode finger pitch that is different from the electrode finger pitch of another of the series-arm resonators that are connected between the first and second shunt-arm resonators.

* * * * *